US011961856B2

(12) United States Patent
Kwag

(10) Patent No.: US 11,961,856 B2
(45) Date of Patent: Apr. 16, 2024

(54) IMAGE SENSING DEVICE INCLUDING ISOLATION DEVICE BETWEEN UNIT PIXEL BLOCKS

(71) Applicant: SK hynix Inc., Icheon-si (KR)

(72) Inventor: Pyong Su Kwag, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 258 days.

(21) Appl. No.: 17/338,347

(22) Filed: Jun. 3, 2021

(65) Prior Publication Data

US 2022/0102402 A1    Mar. 31, 2022

(30) Foreign Application Priority Data

Sep. 29, 2020  (KR) .................. 10-2020-0126852

(51) Int. Cl.
*H01L 27/146* (2006.01)
*H04N 25/77* (2023.01)

(52) U.S. Cl.
CPC .. *H01L 27/14612* (2013.01); *H01L 27/14605* (2013.01); *H04N 25/77* (2023.01)

(58) Field of Classification Search
CPC ......... H01L 27/14612; H01L 27/14605; H01L 27/14641; H01L 27/14603; H01L 27/1463; H04N 25/77; H04N 25/778
See application file for complete search history.

(56) References Cited

U.S. PATENT DOCUMENTS

| 9,332,200 | B1 | 5/2016 | Hseih et al. |
| 2006/0028569 | A1 | 2/2006 | Sekine |
| 2007/0164332 | A1 | 7/2007 | Paik et al. |
| 2010/0282946 | A1 | 11/2010 | Yin et al. |
| 2015/0358562 | A1 | 12/2015 | Egawa |

(Continued)

FOREIGN PATENT DOCUMENTS

| CN | 208210138 U | 12/2018 |
| CN | 110061026 A | 7/2019 |

(Continued)

OTHER PUBLICATIONS

Chinese Patent Office, First Office Action for CN Appl. No. 202110545984.1, mailed on Feb. 7, 2024, 12 pages With English translation.

*Primary Examiner* — Thao X Le
*Assistant Examiner* — Bruce R. Smith
(74) *Attorney, Agent, or Firm* — Perkins Coie LLP

(57) ABSTRACT

An image sensing device includes a first unit pixel block, a second unit pixel block, and an isolation transistor. The first unit pixel block includes a first common floating diffusion node, first photoelectric conversion elements, first transfer transistors and a first conversion gain transistor configured to change capacitance of the first common floating diffusion node. The second unit pixel block adjacent to the first unit pixel block includes a second common floating diffusion node, second photoelectric conversion elements, second transfer transistors and a second conversion gain transistor configured to change capacitance of the second common floating diffusion node. The isolation transistor located in a boundary region between the first unit pixel block and the second unit pixel block isolates the first conversion gain transistor and the second conversion gain transistor from each other.

20 Claims, 5 Drawing Sheets

(56) References Cited

U.S. PATENT DOCUMENTS

| | | | |
|---|---|---|---|
| 2016/0088251 A1 | 3/2016 | Luo et al. | |
| 2018/0213173 A1* | 7/2018 | Oh | H04N 25/622 |
| 2019/0363119 A1* | 11/2019 | Kwag | H01L 27/14641 |
| 2020/0227454 A1* | 7/2020 | Geurts | H04N 25/59 |

FOREIGN PATENT DOCUMENTS

| | | |
|---|---|---|
| CN | 110544699 A | 12/2019 |
| JP | 2008071822 A | 3/2008 |

\* cited by examiner

IMAGE SENSING DEVICE INCLUDING ISOLATION DEVICE BETWEEN UNIT PIXEL BLOCKS

CROSS-REFERENCE TO RELATED APPLICATION

This patent document claims the priority and benefits of Korean patent application No. 10-2020-0126852, filed on Sep. 29, 2020, which is incorporated by reference in its entirety as part of the disclosure of this patent document.

TECHNICAL FIELD

The technology and implementations disclosed in this patent document generally relate to an image sensing device.

BACKGROUND

An image sensing device is used in electronic devices to convert optical images into electrical signals. With the recent development of automotive, medical, computer and communication industries, the demand for highly integrated, higher-performance image sensors has been rapidly increasing in various electronic devices such as digital cameras, camcorders, personal communication systems (PCSs), video game consoles, surveillance cameras, medical micro-cameras, robots, etc.

As the number of higher-resolution image sensors increases, pixels contained in the image sensors become smaller in size, thus increasing the number of pixels without increasing chip size.

SUMMARY

Various embodiments of the disclosed technology relate to an image sensing device for greatly increasing the size of a dual conversion gain (DCG) junction capacitor configured to vary capacitance of a floating diffusion region.

In accordance with an embodiment of the disclosed technology, an image sensing device may include a first unit pixel block, a second unit pixel block, and an isolation transistor. The first unit pixel block may include a first common floating diffusion node, a plurality of first photoelectric conversion elements configured to generate photocharges through conversion of incident light, a plurality of first transfer transistors configured to transmit the photocharges generated by the plurality of first photoelectric conversion elements to the first common floating diffusion node, and a first conversion gain transistor configured to change capacitance of the first common floating diffusion node. The second unit pixel block adjacent to the first unit pixel block in a first direction may include a second common floating diffusion node, a plurality of second photoelectric conversion elements configured to generate photocharges through conversion of incident light, a plurality of second transfer transistors configured to transmit the photocharges generated by the plurality of second photoelectric conversion elements to the second common floating diffusion node, and a second conversion gain transistor configured to change capacitance of the second common floating diffusion node. The isolation transistor may be located in a boundary region between the first unit pixel block and the second unit pixel block, and may isolate the first conversion gain transistor and the second conversion gain transistor from each other.

In accordance with an embodiment of the disclosed technology, an image sensing device may include a first unit pixel block, a second unit pixel block, and an isolation transistor. The first unit pixel block may include a first floating diffusion region configured to store photocharges generated in response to an incident light incident on the first unit pixel block and a first portion of a first active region coupled to the first floating diffusion region through a first common floating diffusion node and including a first conversion gain transistor configured to change capacitance of the first common floating diffusion node. The second unit pixel block adjacent to the first unit pixel block may include a second floating diffusion region configured to store photocharges generated in response to an incident light incident on the second unit pixel block and a second portion of the first active region coupled to the second floating diffusion region through a second common floating diffusion node and including a second conversion gain transistor configured to change capacitance of the second common floating diffusion node. The isolation transistor may be disposed between the first unit pixel block and the second unit pixel block in the first active region to isolate the first conversion gain transistor and the second conversion gain transistor from each other.

It is to be understood that both the foregoing general description and the following detailed description of the disclosed technology are illustrative and explanatory and are intended to provide further explanation of the disclosure as claimed.

DETAILED DESCRIPTION

This patent document provides implementations and examples of an image sensing device and the disclosed features may be implemented to substantially address one or more issues due to limitations and disadvantages of various image sensing devices. Some implementations of the disclosed technology suggest designs of an image sensing device which can greatly increase the size of a dual conversion gain (DCG) junction capacitor configured to change capacitance of a floating diffusion region.

Figure 1:
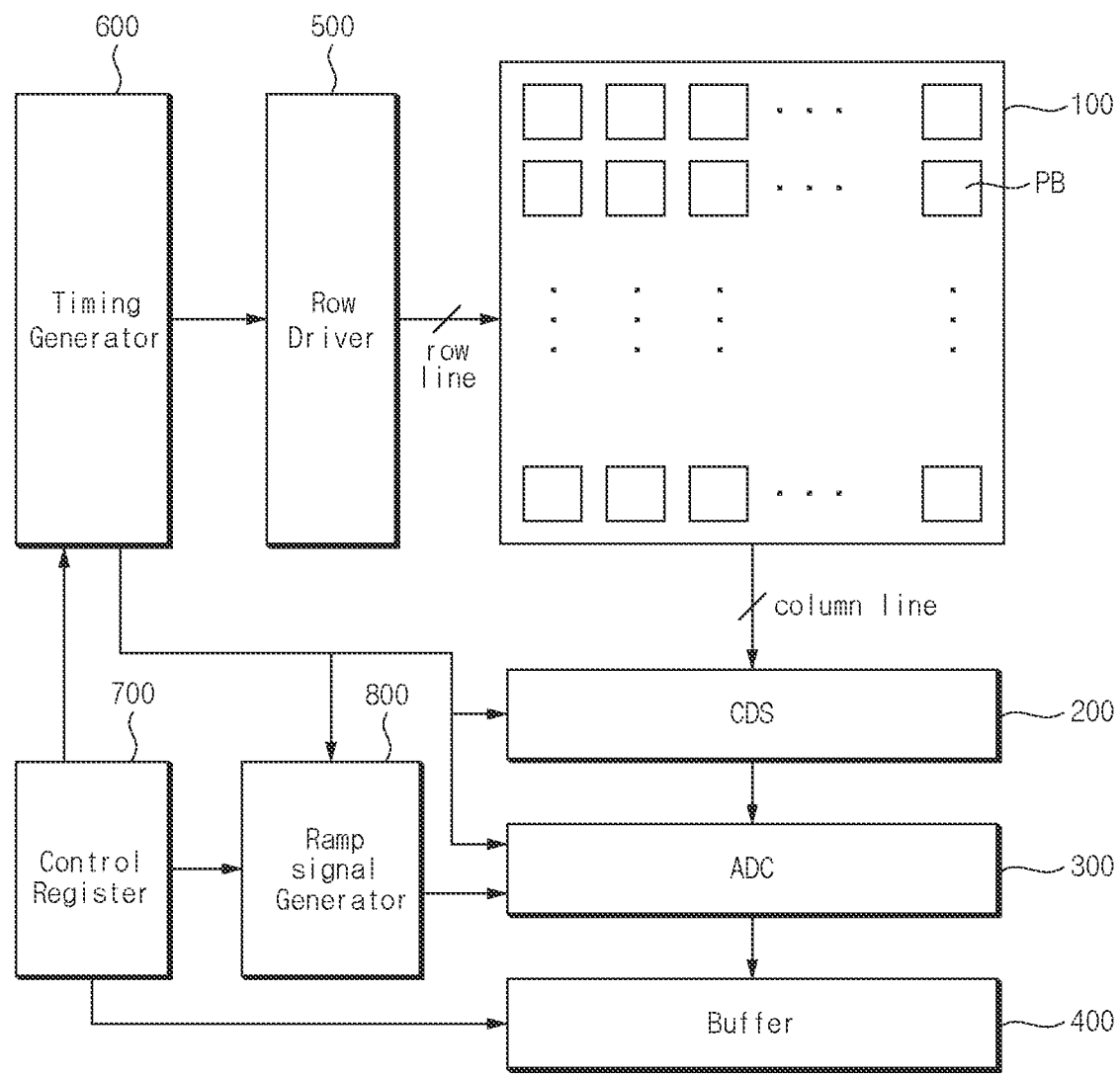
FIG. 1 is a schematic diagram illustrating an example layout of an image sensing device based on some implementations of the disclosed technology.

FIG. 1 is a block diagram illustrating an example of an image sensing device based on some implementations of the disclosed technology.

Referring to FIG. 1, the image sensing device may include a pixel array 100, a correlated double sampler (CDS) 200, an analog-to-digital converter (ADC) 300, a buffer 400, a row driver 500, a timing generator 600, a control register 700, and a ramp signal generator 800.

The pixel array 100 may include a plurality of unit pixel blocks (PBs) arranged in a matrix including columns and rows. Each unit pixel block (PB) may include a plurality of unit pixels configured to share a floating diffusion region and pixel transistors with each other. For example, the unit pixel block (PB) may be formed as an 8-shared pixel structure in which 8 unit pixels share a floating diffusion region, a reset transistor, a source follower transistor, and a selection transistor. In more detail, four unit pixels among the 8 unit pixels may share one floating diffusion region, and the remaining four unit pixels may share another floating diffusion region. Two floating diffusion regions may be interconnected through conductive lines, resulting in formation of one common node (hereinafter referred to as a common floating diffusion node). Each unit pixel may include a photoelectric conversion element for generating photocharges through conversion of incident light received from the outside, and a transfer transistor for transmitting photocharges generated from the photoelectric conversion element to the floating diffusion region. In addition, each unit pixel block (PB) may include a conversion gain transistor and a dual conversion gain (DCG) junction capacitor. Here, the dual conversion gain (DCG) junction capacitor may operate as an impurity region formed by implanting impurities into an upper portion of a semiconductor substrate, and may be used as a source/drain region of a conversion gain transistor. The conversion gain transistor and the dual conversion gain (DCG) junction capacitor may adjust a conversion gain of the image sensing device by changing capacitance of a common floating diffusion node. Specifically, in some implementations, an isolation transistor may be disposed in a boundary region between two adjacent unit pixel blocks (PBs) from among the unit pixel blocks (PBs), such that the isolation transistor disposed in the boundary region can isolate conversion gain transistors of the two adjacent unit pixel blocks (PBs) from each other. A layout structure of the unit pixel blocks (PBs) will be given later. Output nodes of the unit pixel blocks (PBs) may be coupled to column lines.

As discussed above, each unit pixel block (PB) may output the pixel signal to the correlated double sampler (CDS) 200. CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, the correlated double sampler (CDS) 200 may sequentially sample and hold voltage levels of the reference signal and the image signal, which are provided to each of a plurality of column lines from the pixel array 100. For example, the correlated double sampler (CDS) 200 may perform sampling of a reference voltage level and a voltage level of the received pixel signal in response to a clock signal received from the timing generator 600, and may transmit an analog signal corresponding to a difference between the reference voltage level and the voltage level of the received pixel signal to the analog-to-digital converter (ADC) 300.

The analog-to-digital converter (ADC) 300 may be used to convert analog CDS signals to digital signals. In some implementations, the ADC 300 may be implemented as a ramp-compare type ADC. The ramp-compare type ADC may include a comparator circuit for comparing the analog pixel signal with a reference signal such as a ramp signal that ramps up or down, and a timer counts until a voltage of the ramp signal matches the analog pixel signal. In some embodiments of the disclosed technology, the ADC 300 may convert the correlate double sampling signal generated by the CDS 200 for each of the columns into a digital signal, and output the digital signal. The ADC 300 may perform a counting operation and a computing operation based on the correlate double sampling signal for each of the columns and a ramp signal received from the ramp signal generator 800. In this way, the ADC 300 may eliminate or reduce noises such as reset noise arising from the imaging pixels when generating digital image data.

The ADC 300 may include a plurality of column counters. Each column of the pixel array 100 is coupled to a column counter, and image data can be generated by converting the correlate double sampling signals received from each column into digital signals using the column counter. In another embodiment of the disclosed technology, the ADC 300 may include a global counter to convert the correlate double sampling signals corresponding to the columns into digital signals using a global code provided from the global counter.

The buffer 400 may temporarily hold or latch each of the digital signals received from the analog-to-digital converter (ADC) 300, may sense or detect and amplify each of the digital signals, and may output each of the amplified digital signals. Therefore, the buffer 400 may include a memory (not shown) and a sense amplifier (not shown). The memory may store the count value, and the count value may be associated with output signals of the plurality of unit pixels PXs. The sense amplifier may sense and amplify each count value received from the memory.

The row driver 500 may enable or drive the pixel array 100 in response to an output signal of the timing generator 600. For example, the row driver 500 may output drive signals for controlling operations of transistors and conversion gain transistors that are contained in the unit pixel blocks (PBs) to the pixel array 100.

The timing generator 600 may generate a timing signal to control the row driver 500, the correlated double sampler (CDS) 200, the analog-to-digital converter (ADC) 300, and the ramp signal generator 800.

The control register 700 may generate control signals to control the ramp signal generator 800, the timing generator 600, and the buffer 400.

The ramp signal generator 800 may generate a ramp signal in response to a control signal of the control register 700 and a timing signal received from the timing generator 600, and may output the ramp signal to the analog-to-digital converter (ADC) 300.

Figure 2:
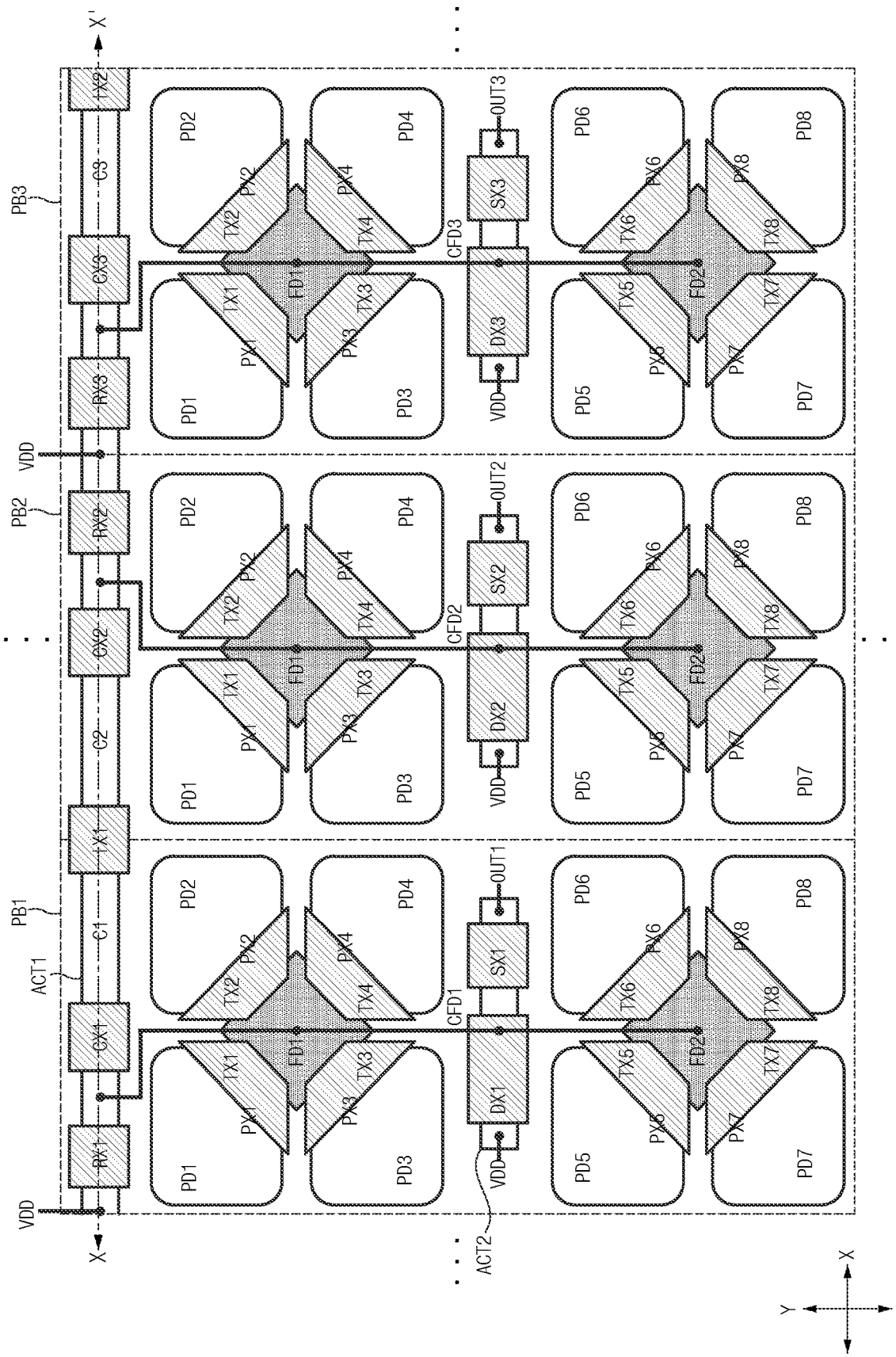
FIG. 2 is a schematic diagram illustrating an example of a layout structure of unit pixel blocks adjacent to each other in an X-axis direction in a pixel array shown in FIG. 1 based on some implementations of the disclosed technology.
Figure 3:
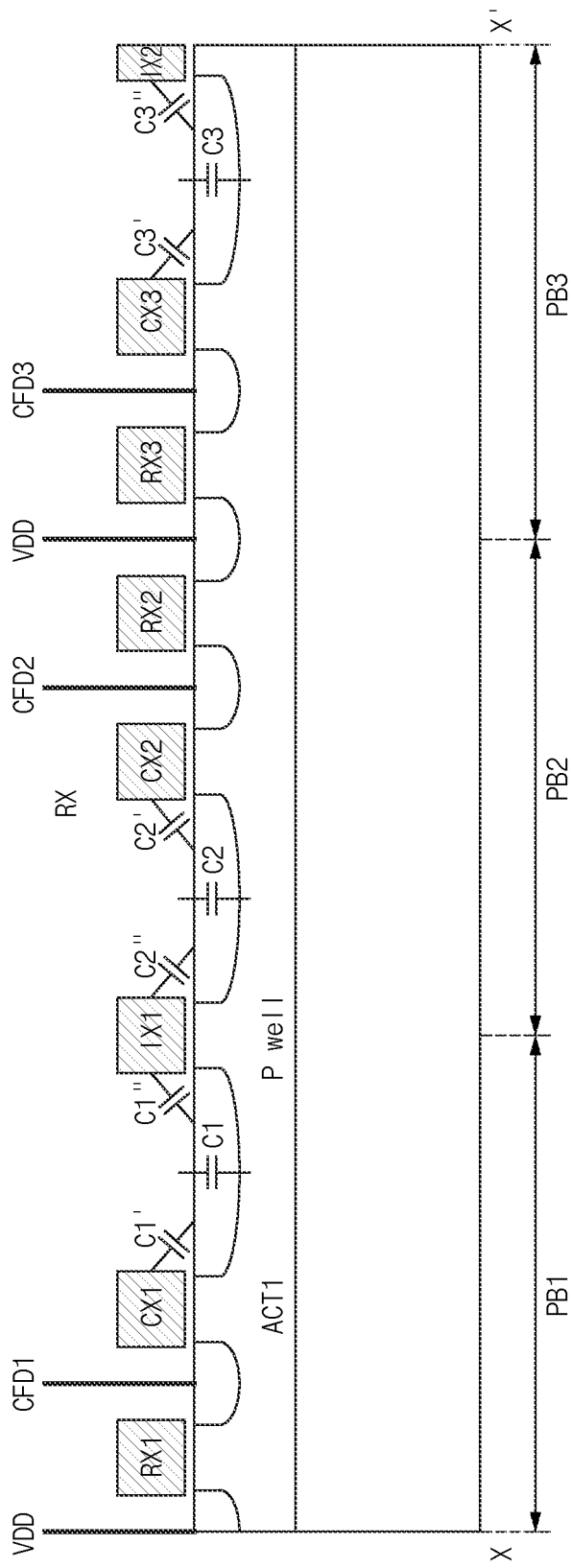
FIG. 3 is a cross-sectional view illustrating an example of unit pixel blocks taken along the line X-X' shown in FIG. 2 based on some implementations of the disclosed technology.

FIG. 2 is a schematic diagram illustrating an example of a layout structure of unit pixel blocks (PBs) adjacent to each other in an X-axis direction in the pixel array shown in FIG. 1 based on some implementations of the disclosed technology. FIG. 3 is a cross-sectional view illustrating an example of the unit pixel blocks (PBs) taken along the line X-X' shown in FIG. 2 based on some implementations of the disclosed technology.

Referring to FIGS. 2 and 3, a unit pixel block PB1 may include a plurality of unit pixels PX1-PX8, a plurality of floating diffusion regions FD1 and FD2, a source follower transistor DX1, a selection transistor SX1, a reset transistor RX1, a conversion gain transistor CX1, and a dual conversion gain (DCG) junction capacitor C1. A unit pixel block PB2 may include a plurality of unit pixels PX1-PX8, a plurality of floating diffusion regions FD1 and FD2, a source follower transistor DX2, a selection transistor SX2, a reset transistor RX2, a conversion gain transistor CX2, and a dual conversion gain (DCG) junction capacitor C2. A unit pixel block PB3 may include a plurality of unit pixels PX1-PX8, a plurality of floating diffusion regions FD1 and FD2, a source follower transistor DX3, a selection transistor SX3, a reset transistor RX3, a conversion gain transistor CX3, and a dual conversion gain (DCG) junction capacitor C3. The conversion gain transistors are configured to change capacitances of corresponding common floating diffusion nodes to support a dynamic range of the image sensor.

In FIG. 2, the reference numerals DX1-DX3, SX1-SX3, RX1-RX3, TX1-TX8, and CX1-CX3 are used to indicate the gates of the corresponding transistors, respectively.

The unit pixels PX1, PX2, PX3, PX4, PX5, PX6, PX7, and PX8 may include photoelectric conversion elements PD1, PD2, PD3, PD4, PD5, PD6, PD7, and PD8, respectively, and may include transfer transistors TX1, TX2, TX3, TX4, TX5, TX6, TX7, and TX8, respectively. Here, each of the photoelectric conversion elements PD1-PD8 may generate photocharges in response to incident light, four transfer transistors TX1-TX4 may transmit photocharges generated by the corresponding photoelectric conversion elements PD1-PD4 to the floating diffusion region FD1, and four transfer transistors TX5-TX8 may transmit photocharges generated by the corresponding photoelectric conversion elements PD5-PD8 to the floating diffusion region FD2. In more detail, the unit pixel PX1 may include the photoelectric conversion element PD1 and the transfer transistor TX1 that transmits photocharges generated by the photoelectric conversion element PD1 to the floating diffusion region FD1. The unit pixel PX2 may include the photoelectric conversion element PD2 and the transfer transistor TX2 that transmits photocharges generated by the photoelectric conversion element PD2 to the floating diffusion region FD1. The unit pixel PX3 may include the photoelectric conversion element PD3 and the transfer transistor TX3 that transmits the photocharges generated by the photoelectric conversion element PD3 to the floating diffusion region FD1. The unit pixel PX4 may include the photoelectric conversion element PD4 and the transfer transistor TX4 that transmits photocharges generated by the photoelectric conversion element PD4 to the floating diffusion region FD1. The unit pixel PX5 may include the photoelectric conversion element PD5 and the transfer transistor TX5 that transmits photocharges generated by the photoelectric conversion element PD5 to the floating diffusion region FD2. The unit pixel PX6 may include the photoelectric conversion element PD6 and the transfer transistor TX6 that transmits photocharges generated by the photoelectric conversion element PD6 to the floating diffusion region FD2. The unit pixel PX7 may include the photoelectric conversion element PD7 and the transfer transistor TX7 that transmits the photocharges generated by the photoelectric conversion element PD7 to the floating diffusion region FD2. The unit pixel PX8 may include the photoelectric conversion element PD8 and the transfer transistor TX8 that transmits the photocharges generated by the photoelectric conversion element PD8 to the floating diffusion region FD2.

Each of the photoelectric conversion elements PD1-PD8 may include photosensing structures capable of generating photocharges in response to an incident light. Each of the photoelectric conversion elements PD1-PD8 may include a photodiode, a phototransistor, a photogate, a pinned photodiode, or a combination thereof. For example, the photoelectric conversion elements PD1-PD8 may be formed in a lower portion of the substrate, and may be formed in a stacked structure in which impurity regions (i.e., P-type impurity region and N-type impurity region) having complementary conductivities are vertically stacked.

The transfer transistors TX1-TX4 may be coupled to the corresponding photoelectric conversion elements PD1-PD4 and the floating diffusion region FD1. The transfer transistors TX5-TX8 may be coupled to the corresponding photoelectric conversion elements PD5-PD8 and the floating diffusion region FD2. For example, one terminal of the transfer transistor TX1, TX2, TX3 or TX4 may be coupled to the photoelectric conversion element PD1, PD2, PD3 or PD4, and the other terminal of the transfer transistor TX1, TX2, TX3 or TX4 may be coupled to the floating diffusion region FD1. One terminal of the transfer transistor TX5, TX6, TX7 or TX8 may be coupled to the photoelectric conversion element PD5, PD6, PD7 or PD8, and the other terminal of the transfer transistor TX5, TX6, TX7 or TX8 may be coupled to the floating diffusion region FD2. The transfer transistors TX1-TX4 may be turned on or off in response to transmission signals applied to transfer gates, such that the transfer transistors TX1-TX4 may transmit photocharges generated by the photoelectric conversion elements PD1-PD4 to the corresponding floating diffusion region FD1. The transfer transistors TX5-TX8 may be turned on or off in response to transmission signals applied to transfer gates, such that the transfer transistors TX5-TX8 may transmit photocharges generated by the photoelectric conversion elements PD5-PD8 to the corresponding floating diffusion region FD2.

The floating diffusion region FD1 may temporarily store photocharges received through the transfer transistors TX1-TX4. The floating diffusion region FD2 may temporarily store photocharges received through the transfer transistors TX5-TX8. Each of the floating diffusion regions FD1 and FD2 may include an impurity region that is formed by implanting impurities (e.g., N-type impurities) into an upper portion of the substrate to a predetermined depth. The floating diffusion regions FD1 and FD2 of each of the unit pixel blocks PB1-PB3 may be coupled to each other through conductive lines such as metal lines, resulting in formation of common floating diffusion nodes CFD1-CFD3. Thus, each of the unit pixel blocks PB1-PB3 may include an 8-shared pixel structure in which two floating diffusion regions FD1 and FD2 are commonly coupled to each other so that the two floating diffusion regions FD1 and FD2 are shared by 8 unit pixels PX1-PX8. In the unit pixel blocks PB1-PB3, the common floating diffusion nodes CFD1-CFD3 may be formed to couple the gates of source follower transistors DX1-DX3, terminals (e.g., source/drain regions) of reset transistors RX1-RX3 and terminals (e.g., source/drain regions) of conversion gain transistors CX1-CX3. In some implementations, the common floating diffusion nodes CFD1-CFD3 may include a conductive line.

The 8 unit pixels PX1-PX8 contained in each of the unit pixel blocks PB1-PB3 may be structured such that four unit pixels from among the 8 unit pixels PX1-PX8 share one floating diffusion region and the remaining four unit pixels share the other floating diffusion region. For example, the four unit pixels PX1-PX4 from among the 8 unit pixels PX1-PX8 may be arranged to surround the floating diffusion region FD1, and may thus share the floating diffusion region FD1. The remaining four unit pixels PX5-PX8 may be arranged to surround the floating diffusion region FD2, and may thus share the floating diffusion region FD2.

For convenience of description, a subpixel block is defined within each of the unit pixel blocks PB1-PB3. The subpixel block PB_S1 is defined in each of the unit pixel blocks PB1-PB3 to include four unit pixels configured to share a first single floating diffusion region and the first shared floating diffusion region. The subpixel block PB_S2 is defined in each of the unit pixel blocks PB1-PB3 to include the remaining four unit pixels configured to share a second single floating diffusion region and the second shared floating diffusion region. For example, as shown in FIG. 2, the subpixel block PB_S1 may refer to a unit block that includes the first floating diffusion region FD1 and four unit pixels PX1-PX4 configured to share the first floating diffusion region FD1. In addition, the subpixel block PB_S2 may refer to a unit block that includes the floating diffusion region FD2 and four unit pixels PX5-PX8 configured to share the floating diffusion region FD2.

In each of the unit pixel blocks PB1-PB3, the first subpixel block PB_S1 and the second subpixel block PB_S2 may be spaced apart from each other by a predetermined distance in a Y-axis direction. The first subpixel block PB_S1 may be identical in terms of structure and size to those of the second subpixel block PB_S2.

In the unit pixel block PB1, the source follower transistor DX1 and the selection transistor SX1 may be arranged along a line between the subpixel blocks PB_S1 and PB_S2 that are disposed in a Y-axis direction. In the unit pixel block PB2, the source follower transistor DX2 and the selection transistor SX2 may be arranged along a line between the subpixel blocks PB_S1 and PB_S2 that are disposed in a Y-axis direction. In the unit pixel block PB3, the source follower transistor DX3 and the selection transistor SX3 may be arranged along a line between the subpixel blocks PB_S1 and PB_S2 that are disposed in a Y-axis direction. In the unit pixel block PB1, the source follower transistor DX1 and the selection transistor SX1 may be coupled in series and disposed between a power-supply voltage node VDD and an output node OUT1. In the unit pixel block PB2, the source follower transistor DX2 and the selection transistor SX2 may be coupled in series and disposed between a power-supply voltage node VDD and an output node OUT2. In the unit pixel block PB3, the source follower transistor DX3 and the selection transistor SX3 may be coupled in series and disposed between a power-supply voltage node VDD and an output node OUT3. The source follower transistor DX1 may output a signal corresponding to the magnitude of voltage of the common floating diffusion node CFD1, and the selection transistor SX1 may transmit an output signal of the source follower transistor DX1 to the output node OUT1 based on a selection signal SS. The source follower transistor DX2 may output a signal corresponding to the magnitude of voltage of the common floating diffusion node CFD2, and the selection transistor SX2 may transmit an output signal of the source follower transistor DX2 to the output node OUT2 based on a selection signal SS. The source follower transistor DX3 may output a signal corresponding to the magnitude of voltage of the common floating diffusion node CFD3, and the selection transistor SX3 may transmit an output signal of the source follower transistor DX3 to the output node OUT3 based on a selection signal SS. Thus, the conversion gain of the unit pixels in the image sensing device based on some implementations of the disclosed technology can be determined by capacitance of the common floating diffusion nodes CFD1-CFD3.

In the unit pixel blocks PB1-PB3, gates of the source follower transistors DX1-DX3 and gates of the selection transistors SX1-SX3 may be arranged along a line and over a single active region ACT2 while being spaced apart from each other by a predetermined distance in the X-axis direction. In more detail, in the unit pixel block PB1, the gate of the source follower transistors DX1 and the gate of the selection transistor SX1 may be arranged along a line and over a single active region ACT2 while being spaced apart from each other by a predetermined distance in the X-axis direction. In the unit pixel block PB2, the gate of the source follower transistors DX2 and the gate of the selection transistor SX2 may be arranged along a line and over a single active region ACT2 while being spaced apart from each other by a predetermined distance in the X-axis direction. In the unit pixel block PB3, the gate of the source follower transistors DX3 and the gate of the selection transistor SX3 may be arranged along a line and over a single active region ACT2 while being spaced apart from each other by a predetermined distance in the X-axis direction. In the active region ACT2 of each unit pixel block PB1-PB3, one region (e.g., a source region or a drain region) of the gate of each source follower transistor DX1-DX3 may be coupled to the power-supply voltage node VDD, and one region (e.g., a source region or a drain region) of the gate of each selection transistor SX1-SX3 may be coupled to the output node OUT1-OUT3.

In the unit pixel blocks PB1-PB3, the reset transistors RX1-RX3 and the conversion gain transistors CX1-CX3 may be arranged linearly at the other side of the subpixel block PB_S1 that is opposite in a Y-axis direction to the side of the subpixel block PB_S1 where the source follower transistors DX1-DX3 and the selection transistors SX1-SX3 are disposed. In more detail, in the unit pixel block PB1, the reset transistor RX1 and the conversion gain transistor CX1 may be arranged along a line at the other side of the subpixel block PB_S1 that is opposite in a Y-axis direction to the side of the subpixel block PB_S1 where the source follower transistor DX1 and the selection transistor SX1 are disposed. In the unit pixel block PB2, the reset transistor RX2 and the conversion gain transistor CX2 may be arranged along a line at the other side of the subpixel block PB_S1 that is opposite in a Y-axis direction to the side of the subpixel block PB_S1 where the source follower transistors DX2 and the selection transistor SX2 are disposed. In the unit pixel block PB3, the reset transistor RX3 and the conversion gain transistor CX3 may be arranged along a line at the other side of the subpixel block PB_S1 that is opposite in a Y-axis direction to the side of the subpixel block PB_S1 where the source follower transistors DX3 and the selection transistors SX3 are disposed. The reset transistors RX1-RX3 and the conversion gain transistors CX1-CX3 of the unit pixel blocks PB1-PB3 may be formed in one active region ACT1. For example, the active region ACT1 may extend to traverse all of the unit pixel blocks PB1-PB3 adjacent to each other in a X-axis direction, and the reset transistors RX1-RX3 and the conversion gain transistors CX1-CX3 of the unit pixel blocks PB1-PB3 may be formed in one active region ACT1. Although the active region ACT1 shown in FIG. 2 is formed to traverse three unit pixel blocks PB1-PB3 for convenience of description, other implementations are also possible. For example, the active region ACT1 may also extend to traverse the entire pixel array 100 as necessary.

In some implementations, in any two adjacent unit pixel blocks PB1-PB3, the reset transistor and the conversion gain transistor of one of the two adjacent unit pixel blocks PB1-PB3 may be arranged symmetrical to the reset transistor and the conversion gain transistor of the other of the two adjacent unit pixel blocks PB1-PB3 with respect to a boundary line between any two adjacent unit pixel blocks PB1-PB3. For example, the reset transistor RX1 and the conversion gain transistor CX1 of the unit pixel block PB1 may be arranged symmetrical to the reset transistor RX2 and the conversion gain transistor CX2 of the unit pixel block PB2. As an example, due to the symmetrical arrangement in FIG. 2, the reset transistor RX1 and the conversion gain transistor CX1 have same sizes as the reset transistor RX2 and the conversion gain transistor CX2, respectively, and the conversion gain transistors CX1 and CX2 are disposed closer to the boundary line between the two adjacent unit pixel blocks PB1 and PB2 than the reset transistors RX1 and RX2. Such symmetrical arrangement of some elements can be referred to as a flip structure. For example, the reset transistor RX2 and the conversion gain transistor CX2 of the unit pixel block PB2 may be arranged symmetrical to (or in a flip structure with) the reset transistor RX3 and the conversion gain transistor CX3 of the unit pixel block PB3. Thus, the reset transistor RX2 and the conversion gain transistor CX2 have same sizes as the reset transistor RX3 and the conversion gain transistor CX3, respectively, and the reset transistors RX2 and RX3 are disposed closer to the boundary line between the two adjacent unit pixel blocks PB2 and PB3 than the conversion gain transistors CX2 and CX3.

For two adjacent unit pixel blocks PB1 and PB2, an isolation transistor IX1 for isolating the conversion gain transistors CX1 and CX2 from each other may be formed in the active region ACT1. The isolation transistor IX1 may be disposed in a boundary region between the unit pixel blocks PB1 and PB2. For example, for two adjacent unit pixels PB1 and PB2 that are included in the pixel array 100, the isolation transistor IX1 may be formed in a boundary region between the two unit pixel blocks PB1 and PB2. In the active region ACT1, a gate of the isolation transistor IX1 may be disposed in the boundary region between the unit pixel blocks PB1 and PB2, and gates of the conversion gain transistors CX1 and CX2 may be disposed at both sides of the gate of the isolation transistor IX1. Here, in the active region ACT1, source/drain regions formed between the gate of the isolation transistor IX1 and the gates of the conversion gain transistors CX1 and CX2 may be used as junction capacitors C1 and C2.

In the conventional technologies, a device isolation structure such as a trench-shaped device isolation structure or a junction isolation structure formed by implantation of impurities is used to isolate adjacent active regions. To isolate the active region in which the reset transistor RX1 and the conversion gain transistor CX1 of the unit pixel block PB1 are formed from the other active region in which the reset transistor RX2 and the conversion gain transistor CX2 of the unit pixel block PB2 are formed by the device isolation structure (e.g., a trench-shaped device isolation structure or a junction isolation structure formed by implantation of impurities), the device isolation structure needs to be formed in at least a predetermined size, which begins to limit spaces for the active regions. Thus, with the device isolation structure, the space for the source/drain region of the conversion gain transistor CX1 reduces and thus it is difficult to form the junction capacitor, which corresponds to the source/drain region of the conversion gain transistor CX1, with a sufficiently large size. In addition, when the device isolation structure is formed with a junction isolation structure, a deviation in junction capacitance between the unit pixel blocks may occur due to an overlay change of an implant mask pattern. Such deviation may greatly affect operations of the image sensing device in a situation in which the junction capacitor is formed in a small size.

In recognition of the issues above, some implementations of the disclosed technology suggest configuring an isolation transistor to isolate two adjacent conversion gain transistors CX1 and CX2. In some implementations, when the conversion gain transistors CX1 and CX2 are isolated from each other by the isolation transistor IX1, the gate of the isolation transistor IX1 needs to be formed between the conversion gain transistors CX1 and CX2. In this case, since there is no need to form the junction isolation structure, each of the source/drain regions (e.g., the junction capacitors C1 and C2) of the conversion gain transistors CX1 and CX2 can be formed in a larger size.

In addition, capacitance (e.g., DCG capacitance) for dual conversion gain (DCG) may be denoted by the sum of capacitance of the junction capacitors C1 and C2, parasitic capacitance generated by parasitic capacitors C1' and C2' of the conversion gain transistors CX1 and CX2, and parasitic capacitance generated by parasitic capacitors C1" and C2" of the isolation transistor IX1. Thus, DCG capacitance in a situation in which the isolation transistor IX1 is formed may be greater than DCG capacitance in a situation in which the isolation transistor IX1 is not formed.

If such DCG capacitance increases, although the overlay change occurs as discussed above, the effect of capacitance deviation caused by such overlay change can be greatly reduced.

In the active region ACT1, the source/drain regions between the gates of the reset transistors RX1-RX3 and the gates of the conversion gain transistors CX1-CX3 may be respectively coupled to the common floating diffusion nodes CFD1-CFD3 of the unit pixel blocks PB1-PB3. The source/drain regions of the other sides of the reset transistors RX1-RX3 may be coupled to the power-supply voltage node VDD.

Figure 4:
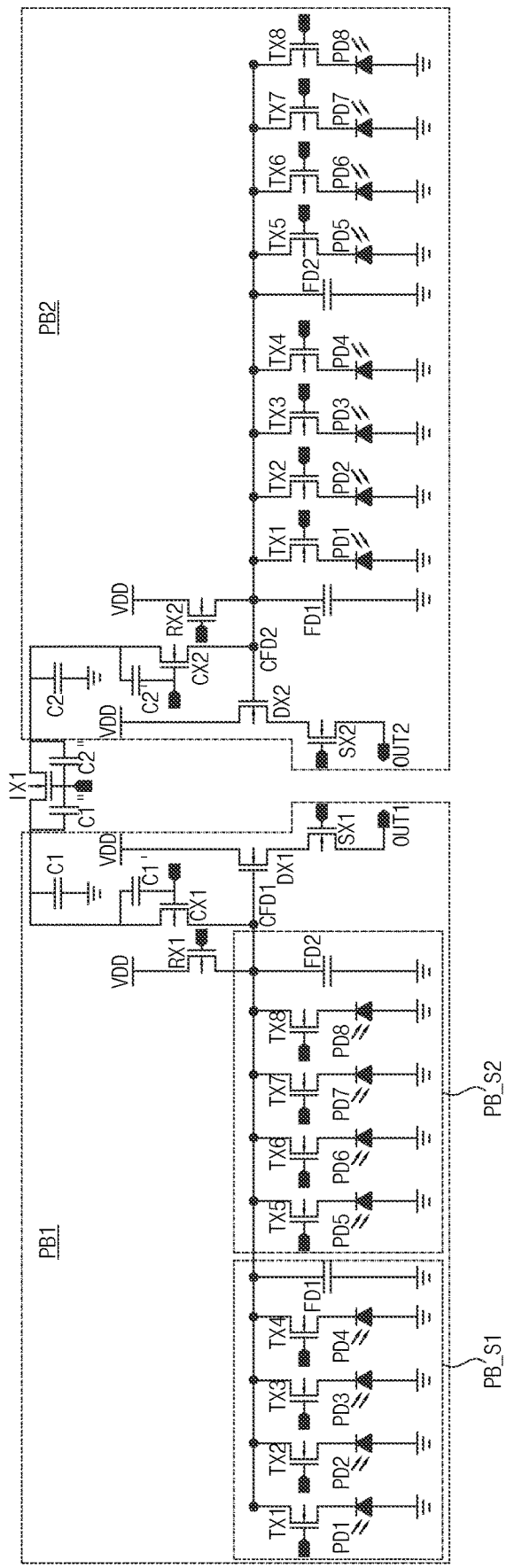
FIG. 4 is a circuit diagram illustrating an example of adjacent unit pixel blocks shown in FIG. 2 and an isolation transistor disposed between the adjacent unit pixel blocks based on some implementations of the disclosed technology.

FIG. 4 is a circuit diagram illustrating an example of adjacent unit pixel blocks shown in FIG. 2 and the isolation transistor disposed between the adjacent unit pixel blocks based on some implementations of the disclosed technology.

Referring to FIG. 4, in each of the unit pixel blocks PB1 and PB2, transfer transistors TX1-TX8 may be coupled between the floating diffusion regions FD1 and FD2 and the photoelectric conversion elements PD1-PD8. The floating diffusion regions FD1 and FD2 may be coupled in parallel to each other, resulting in formation of the common floating diffusion nodes CFD1 and CFD2.

The reset transistor RX1 may be coupled to the power-supply voltage node VDD and the common floating diffusion node CFD1, and the reset transistor RX2 may be coupled to the power-supply voltage node VDD and the common floating diffusion node CFD2. The reset transistor RX1 may initialize the common floating diffusion node CFD1 to the power-supply voltage level in response to a reset signal applied to the gate of the reset transistor RX1. The reset transistor RX2 may initialize the common floating diffusion node CFD2 to the power-supply voltage level in response to a reset signal applied to the gate of the reset transistor RX2.

The conversion gain transistor CX1 may be coupled to the common floating diffusion node CFD1 and the isolation transistor IX1, and the conversion gain transistor CX2 may be coupled to the common floating diffusion node CFD2 and the isolation transistor IX1. The conversion gain transistor CX1 may change capacitance of the common floating diffusion node CFD1 in response to a conversion gain control signal applied to the gate of the conversion gain transistor CX1, and the conversion gain transistor CX2 may change capacitance of the common floating diffusion node CFD2 in response to a conversion gain control signal applied to the gate of the conversion gain transistor CX2.

For example, when the conversion gain transistors CX1 and CX2 are turned off, capacitance of each of the common floating diffusion nodes CFD1 and CFD2 may be denoted by the sum of capacitances of the floating diffusion regions FD1 and FD2. When the conversion gain transistor CX1 is turned on, capacitance of the common floating diffusion node CFD1 may be denoted by the sum of capacitance of the floating diffusion regions FD1 and FD2 of the unit pixel block PB1, capacitance of the junction capacitor C1, parasitic capacitance caused by the parasitic capacitor C1' of the conversion gain transistor CX1, and parasitic capacitance caused by the parasitic capacitor C1" of the isolation transistor IX1. When the conversion gain transistor CX2 is turned on, capacitance of the common floating diffusion node CFD2 may be denoted by the sum of capacitance of the floating diffusion regions FD1 and FD2 of the unit pixel block PB2, capacitance of the junction capacitor C2, parasitic capacitance caused by the parasitic capacitor C2' of the conversion gain transistor CX2, and parasitic capacitance caused by the parasitic capacitor C2" of the isolation transistor IX1.

The isolation transistor IX1 may be coupled between the conversion gain transistors CX1 and CX2 of the unit pixel blocks PB1 and PB2, and may isolate the conversion gain transistors CX1 and CX2 from each other in response to an isolation control signal applied to the gate of the isolation transistor IX1. In some implementations, the isolation transistor IX1 may always remain turned off.

The source follower transistor DX1 and the selection transistor SX1 may be coupled in series between the power-supply voltage node VDD and the output node OUT1. The gate of the source follower transistor DX1 is coupled to the common floating diffusion node CFD1, such that the source follower transistor DX1 may output a signal corresponding to the magnitude of voltage of the common floating diffusion node CFD1. The selection transistor SX1 may transmit an output signal of the source follower transistor DX1 to the output node OUT1 based on a selection signal. The source follower transistor DX2 and the selection transistor SX2 may be coupled in series between the power-supply voltage node VDD and the output node OUT2. The gate of the source follower transistor DX2 is coupled to the common floating diffusion node CFD2, such that the source follower transistor DX2 may output a signal corresponding to the magnitude of voltage of the common floating diffusion node CFD2. The selection transistor SX2 may transmit an output signal of the source follower transistor DX2 to the output node OUT2 based on a selection signal.

Figure 5:
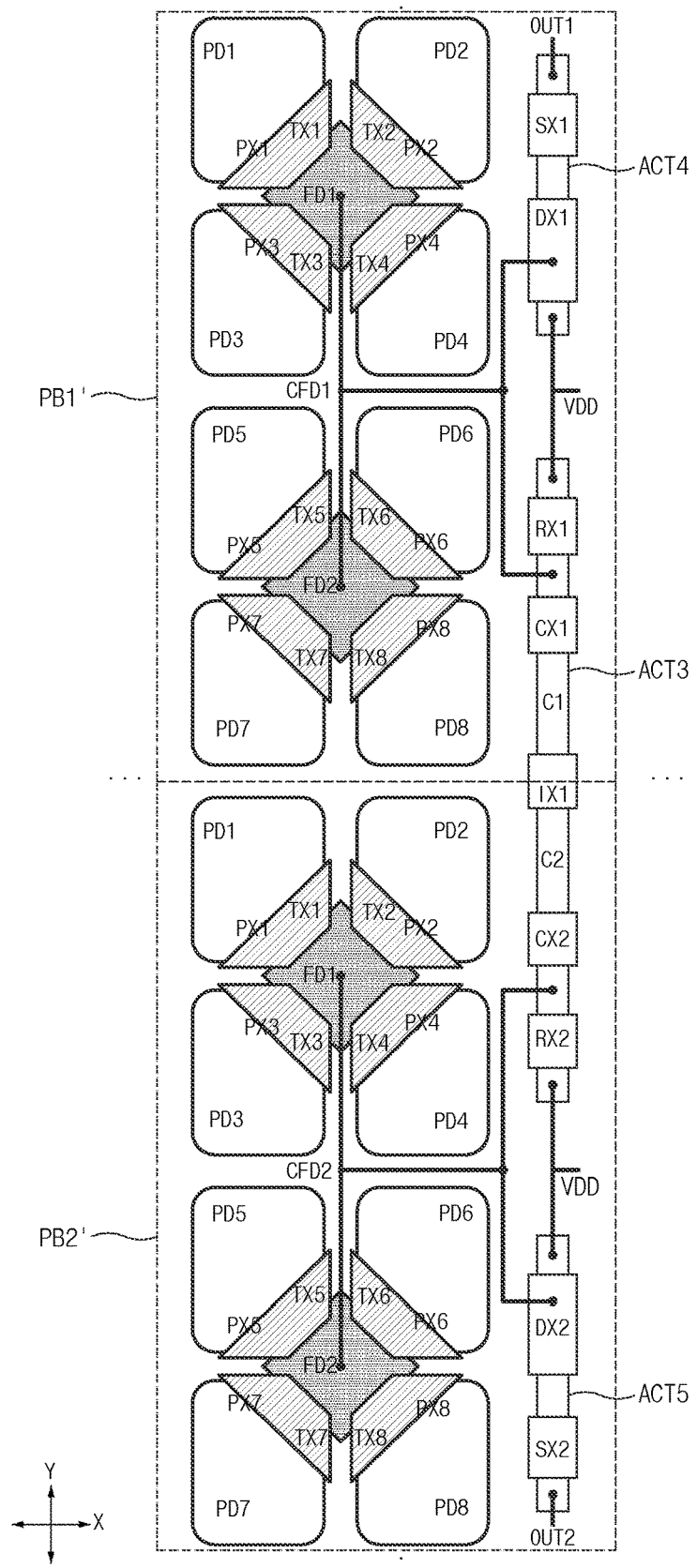
FIG. 5 is a schematic diagram illustrating an example of a layout structure of unit pixel blocks adjacent to each other in a Y-axis direction in a pixel array shown in FIG. 1 based on some other implementations of the disclosed technology.

FIG. 5 is a schematic diagram illustrating an example of a layout structure of unit pixel blocks that are adjacent to each other in a Y-axis direction in the pixel array shown in FIG. 1 based on some other implementations of the disclosed technology. In FIG. 5, the same reference numerals as those of FIG. 2 will be used to refer to the same or like parts for convenience of description and better understanding of the disclosed technology.

In comparison with the unit pixel blocks PB1 and PB2 shown in FIG. 2, pixel transistors DX1, DX2, SX1, SX2, RX1, RX2, CX1, and CX2 may be arranged along a line and in a Y-axis direction in the unit pixel blocks PB1' and PB2' shown in FIG. 5. In this case, the pixel transistors SX1, DX1, RX1, and CX1 of the unit pixel block PB1' and the pixel transistors SX2, DX2, RX2, and CX2 of the unit pixel block PB2' may be arranged symmetrical or in a flip structure in a Y-axis direction.

As described above, when the pixel transistors are arranged along a line and in a Y-axis direction, the active region ACT3 may be formed to extend in the Y-axis direction so that the active region ACT3 can be shared by the unit pixel blocks PB1' and PB2' that are adjacent to each other in the Y-axis direction. In addition, the reset transistor RX1 and the conversion gain transistor CX1 of the unit pixel block PB1' and the reset transistor RX2 and the conversion gain transistor CX2 of the unit pixel block PB2' may be formed in the active region ACT3. The isolation transistor IX1 for isolating the conversion gain transistors CX1 and CX2 from each other may be formed in a boundary region between the unit pixel blocks PB1' and PB2' in the active region ACT3.

The active region ACT4 in which the selection transistor SX1 and the source follower transistor DX1 are formed and the active region ACT5 in which the selection transistor SX2 and the source follower transistor DX2 are formed may be disposed at both sides of the active region ACT3 in a Y-axis direction.

The relationship of electrical connection among the transistors RX1, CX1, IX1, CX2, and RX2 shown in FIG. 5 is identical to those of FIGS. 3 and 4, and as such a detailed description thereof will herein be omitted for brevity.

As is apparent from the above description, the image sensing device based on some implementations of the disclosed technology can greatly increase the size of a dual conversion gain (DCG) junction capacitor configured to change capacitance of the floating diffusion region.

Although a number of illustrative embodiments have been described, it should be understood that modifications of the disclosed embodiments and other embodiments can be devised based on what is described and/or illustrated in this patent document.

What is claimed is:

1. An image sensing device, comprising:
a first unit pixel block that includes a first common floating diffusion node, a plurality of first photoelectric conversion elements configured to generate photocharges through conversion of incident light, a plurality of first transfer transistors configured to transmit the photocharges generated by the plurality of first photoelectric conversion elements to the first common floating diffusion node, and a first conversion gain transistor configured to change capacitance of the first common floating diffusion node;
a second unit pixel block adjacent to the first unit pixel block in a first direction, that includes a second common floating diffusion node, a plurality of second photoelectric conversion elements configured to generate photocharges through conversion of incident light, a plurality of second transfer transistors configured to transmit the photocharges generated by the plurality of second photoelectric conversion elements to the second common floating diffusion node, and a second conversion gain transistor configured to change capacitance of the second common floating diffusion node; and
an isolation transistor located in a boundary region between the first unit pixel block and the second unit pixel block, and configured to isolate the first conversion gain transistor and the second conversion gain transistor from each other.

2. The image sensing device according to claim 1, wherein:
the first conversion gain transistor, the second conversion gain transistor, and the isolation transistor are arranged in a first active region and along a line.

3. The image sensing device according to claim 2, further comprising:

a first reset transistor disposed in the first unit pixel block, and disposed at one side of the first conversion gain transistor in the first active region; and a second reset transistor disposed in the second unit pixel block, and disposed at one side of the second conversion gain transistor in the first active region.

4. The image sensing device according to claim 3, wherein:
the first reset transistor and the first conversion gain transistor are arranged symmetrically with the second reset transistor and the second conversion gain transistor with respect to the boundary region.

5. The image sensing device according to claim 2, wherein:
the first unit pixel block and the second unit pixel block are adjacent to each other in the first direction; and
the first conversion gain transistor, the second conversion gain transistor, and the isolation transistor are arranged along the first direction.

6. The image sensing device according to claim 5, wherein the first unit pixel block includes:
a second active region spaced apart from the first active region by a predetermined distance in a second direction perpendicular to the first direction,
wherein the second active region includes:
a first source follower transistor configured to output a signal corresponding to a voltage magnitude of the first common floating diffusion node; and
a first selection transistor configured to transmit an output signal of the first source follower transistor to a first output node in response to a first selection signal.

7. The image sensing device according to claim 6, wherein the second unit pixel block includes:
a third active region spaced apart from the first active region by a predetermined distance in the second direction,
wherein the third active region includes:
a second source follower transistor configured to output a signal corresponding to a voltage magnitude of the second common floating diffusion node; and
a second selection transistor configured to transmit an output signal of the second source follower transistor to a second output node in response to a second selection signal.

8. The image sensing device according to claim 7, wherein:
the first source follower transistor and the first selection transistor are arranged to have a same layout structure as that of the second source follower transistor and the second selection transistor.

9. The image sensing device according to claim 5, wherein the first unit pixel block includes:
a second active region disposed at one side of the first active region in the first direction,
wherein the second active region includes:
a first source follower transistor configured to output a signal corresponding to a voltage magnitude of the first common floating diffusion node; and
a first selection transistor configured to transmit an output signal of the first source follower transistor to a first output node in response to a first selection signal.

10. The image sensing device according to claim 9, wherein the second unit pixel block includes:
a third active region disposed at an opposite side of the first active region in the first direction;

wherein the third active region includes:
a second source follower transistor configured to output a signal corresponding to a voltage magnitude of the second common floating diffusion node; and
a second selection transistor configured to transmit an output signal of the second source follower transistor to a second output node in response to a second selection signal.

11. The image sensing device according to claim 10, wherein:
the first source follower transistor and the first selection transistor are arranged symmetrically with the second source follower transistor and the second selection transistor with respect to the boundary region.

12. The image sensing device according to claim 2, wherein:
the isolation transistor is configured to remain turned off.

13. The image sensing device according to claim 1, wherein the first unit pixel block includes:
a first floating diffusion region coupled to the first common floating diffusion node;
a plurality of unit pixels arranged to surround the first floating diffusion region;
a second floating diffusion region coupled to the first common floating diffusion node, and spaced apart from the first floating diffusion region by a predetermined distance; and
a plurality of unit pixels arranged to surround the second floating diffusion region.

14. The image sensing device according to claim 1, wherein the second unit pixel block includes:
a third floating diffusion region coupled to the second common floating diffusion node;
a plurality of unit pixels arranged to surround the third floating diffusion region;
a fourth floating diffusion region coupled to the second common floating diffusion node, and spaced apart from the third floating diffusion region by a predetermined distance; and
a plurality of unit pixels arranged to surround the fourth floating diffusion region.

15. An image sensing device, comprising:
a first unit pixel block including a first floating diffusion region configured to store photocharges generated in response to an incident light incident on the first unit pixel block and a first portion of a first active region coupled to the first floating diffusion region through a first common floating diffusion node and including a first conversion gain transistor configured to change capacitance of the first common floating diffusion node;
a second unit pixel block disposed adjacent to the first unit pixel block and including a second floating diffusion region configured to store photocharges generated in response to an incident light incident on the second unit pixel block and a second portion of the first active region coupled to the second floating diffusion region through a second common floating diffusion node and including a second conversion gain transistor configured to change capacitance of the second common floating diffusion node; and
an isolation transistor disposed between the first unit pixel block and the second unit pixel block in the first active region to isolate the first conversion gain transistor and the second conversion gain transistor from each other.

16. The image sensing device of claim 15, wherein the first unit pixel block and the second unit pixel block are arranged along a first direction and wherein the first active region is extended to traverse the first unit pixel block and the second unit pixel block along the first direction.

17. The image sensing device of claim 15, wherein the first unit pixel block further includes a first reset transistor disposed in the first portion and coupled to the first conversion gain transistor, and wherein the second unit pixel block further includes a second reset transistor disposed in the second portion and coupled to the second conversion gain transistor.

18. The image sensing device of claim 17, wherein the first reset transistor and the first conversion gain transistor are arranged to be symmetrical with the second reset transistor and the second conversion gain transistor with respect to a boundary between the first unit pixel block and the second unit pixel block.

19. The image sensing device of claim 15, wherein the first unit pixel block further includes a second active region including a first selection transistor and a first source follower transistor, and wherein the second unit pixel block further includes a third active region including a second selection transistor and a second source follow transistor.

20. The image sensing device of claim 19, wherein the first source follower transistor is configured to output a first signal corresponding to a first voltage at the first common floating diffusion node and the second source follower transistor is configured to output a second signal corresponding to a second voltage at the second common floating diffusion node.

* * * * *